US008626905B1

(12) United States Patent
Melton

(10) Patent No.: US 8,626,905 B1
(45) Date of Patent: *Jan. 7, 2014

(54) MONITORING A SELF-CONTAINED SERVER RACK SYSTEM

(75) Inventor: Brandon W. Melton, San Antonio, TX (US)

(73) Assignee: United Services Automobile Association (USAA), San Antonio, TX (US)

( * ) Notice: Subject to any disclaimer, the term of this patent is extended or adjusted under 35 U.S.C. 154(b) by 170 days.

This patent is subject to a terminal disclaimer.

(21) Appl. No.: 13/084,743

(22) Filed: Apr. 12, 2011

Related U.S. Application Data

(63) Continuation of application No. 12/246,074, filed on Oct. 6, 2008, now Pat. No. 7,925,746.

(51) Int. Cl.
*G06F 15/16* (2006.01)
*G06F 15/173* (2006.01)
*G06F 15/177* (2006.01)

(52) U.S. Cl.
USPC ........ 709/224; 713/300; 454/184; 312/223.2; 312/236; 361/679.46

(58) Field of Classification Search
USPC .......... 361/679.46, 679.49, 679.53, 688–690, 361/692, 694–696, 698–699, 701, 704, 361/715–716, 724; 165/80.3–80.4, 104.33, 165/185; 312/223.2, 236; 454/184
See application file for complete search history.

(56) References Cited

U.S. PATENT DOCUMENTS

| | | | |
|---|---|---|---|
| 6,307,750 B1 * | 10/2001 | Bendikas et al. | 361/725 |
| 6,535,382 B2 * | 3/2003 | Bishop et al. | 361/690 |
| 7,144,320 B2 * | 12/2006 | Turek et al. | 454/184 |
| 7,365,973 B2 | 4/2008 | Rasmussen et al. | |
| 7,542,285 B2 | 6/2009 | Colucci et al. | |
| 7,600,148 B1 | 10/2009 | Shaw et al. | |
| 7,685,465 B1 | 3/2010 | Shaw et al. | |
| 2004/0190270 A1 * | 9/2004 | Aldag et al. | 361/752 |
| 2007/0074525 A1 * | 4/2007 | Vinson et al. | 62/259.2 |
| 2007/0089859 A1 | 4/2007 | Wei | |
| 2007/0187343 A1 * | 8/2007 | Colucci et al. | 211/26 |
| 2008/0037217 A1 | 2/2008 | Murakami et al. | |

(Continued)

OTHER PUBLICATIONS

"Case Study: Sun Microsystems Energy-Efficient Modular Cooling System", Silicon Valley Leadership Group, 2008, 4 pages, Dec. 31.

*Primary Examiner* — Haresh N Patel
(74) *Attorney, Agent, or Firm* — Brooks Cameron & Huebsch, PLLC

(57) ABSTRACT

A refrigerated server rack that may be used in a server room to cool computing equipment. The refrigerated server rack may contain a cooling unit or include a cooling inlet to receive chilled air to cool the computing equipment within the server rack. The self contained server rack has a modular design such that it may be easily integrated into mounting point within a data center. As the requirements of the data center change, server racks may be added or removed to provide scalability. As the racks are added or removed, a monitoring application discovers the server racks and equipment contained therein. The server rack and equipment may then be configured to operate within the data center computing infrastructure. Because only the interior of the self-contained server rack is cooled to maintain a proper operating environment for the computing equipment, there is no need to cool entirety of the data center.

21 Claims, 4 Drawing Sheets

(56) References Cited

U.S. PATENT DOCUMENTS

| | | |
|---|---|---|
| 2008/0163628 A1 | 7/2008 | Lilke |
| 2008/0174961 A1 | 7/2008 | Campbell et al. |
| 2009/0021907 A1* | 1/2009 | Mann et al. .................. 361/686 |
| 2009/0044027 A1 | 2/2009 | Piazza |
| 2009/0138313 A1* | 5/2009 | Morgan et al. .................. 705/8 |
| 2009/0173473 A1* | 7/2009 | Day .................. 165/67 |
| 2009/0219536 A1 | 9/2009 | Piazza |
| 2009/0287866 A1 | 11/2009 | Mejias |
| 2009/0308579 A1* | 12/2009 | Johnson et al. .......... 165/104.34 |
| 2009/0309570 A1 | 12/2009 | Lehmann et al. |

* cited by examiner

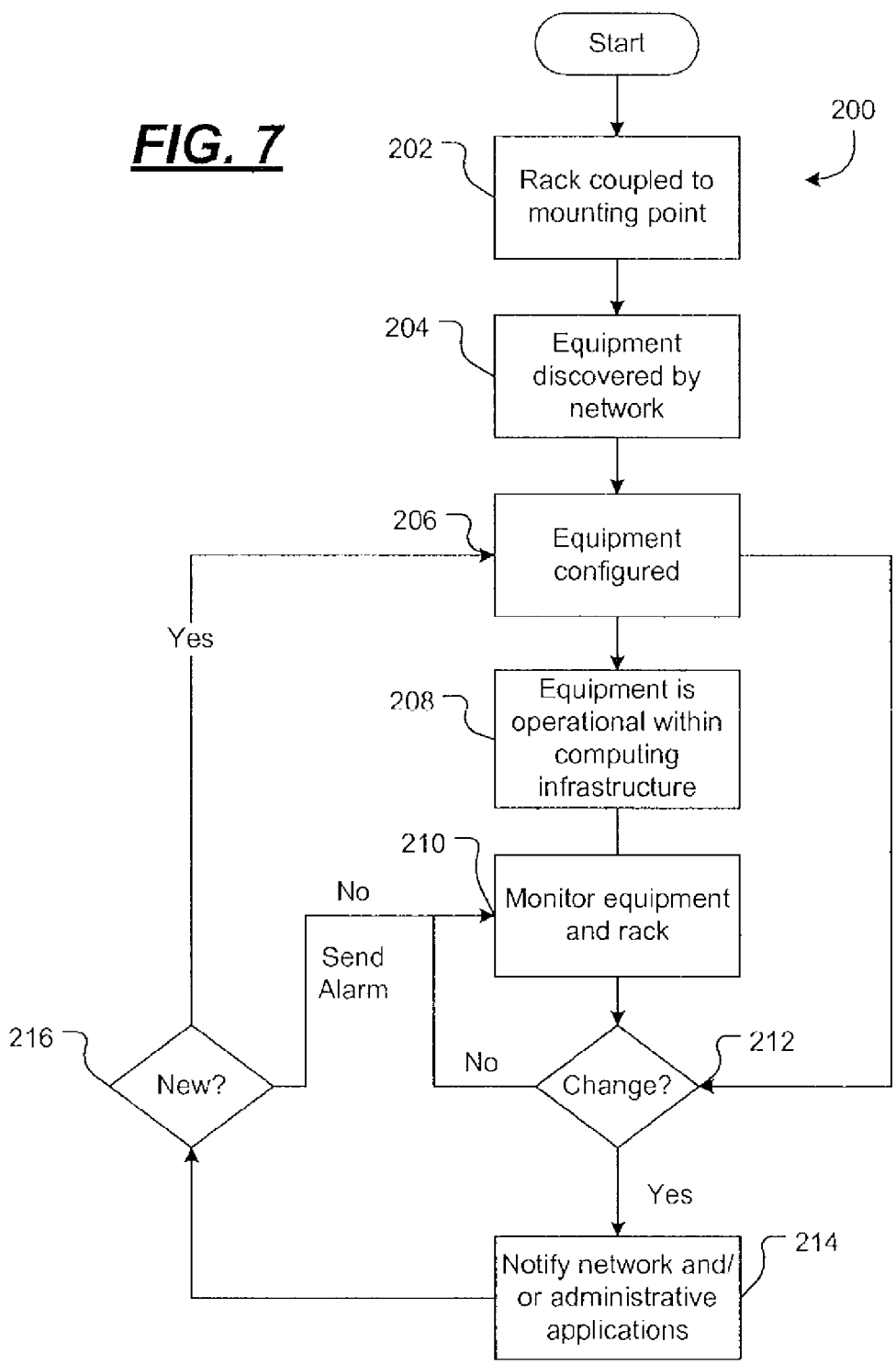

MONITORING A SELF-CONTAINED SERVER RACK SYSTEM

CROSS REFERENCES

The present application is a continuation of U.S. patent application Ser. No. 12/246,074, filed Oct. 6, 2008—now U.S. Pat. No. 7,925,746, which is related in subject matter in the following commonly assigned application Ser Nos. 12/246,081 filed on Oct. 6, 2008—now abandoned—and 12/246,089 filed on Oct. 6, 2008—now abandoned.

BACKGROUND

The rise in demand for IT business support and the resulting increase in density of IT equipment are stretching data center power and cooling resources to the breaking point. Recently, energy costs and the inability of data center infrastructures to accommodate new high-density computing platforms have become problems for data centers. Higher rack densities have caused power and cooling costs to surpass the costs of the IT equipment and the facility space.

The increase in server density is being driven by the need to maximize the use of data center floor space and to extend the life of data centers. As a result, rack power density (kW/rack) has grown more than five times over the past ten years. The growth in rack power density and the associated heat load are outpacing conventional thermal management techniques, which are typically designed for previous generations of IT equipment.

To lower total cost of ownership (TCO), data centers are struggling to adopt a paradigm that focuses on maximizing the energy efficiency of components, systems, and the infrastructure while controlling energy usage. Because the demand for IT business support will continue to increase, an organization's best strategy to manage growth is to improve power and cooling infrastructure efficiency.

SUMMARY

A self-contained server rack that may be used in a server room or data center to cool computing equipment within the server rack. The server rack may include an integrated cooling unit or a cooling inlet to receive chilled air to cool computing equipment within the server rack. The self-contained server rack has a modular design such that it may be easily integrated into mounting point within a data center. As the requirements of the data center change, server racks may be added or removed to provide scalability. As the racks are added or removed, a monitoring application discovers the server racks and equipment contained therein. The server rack and equipment may then be configured to operate within the data center computing infrastructure. Because only the interior of the self-contained server rack is cooled to maintain a proper operating environment for the computing equipment, there is no need to cool entirety of the data center.

This summary is provided to introduce a selection of concepts in a simplified form that are further described in the detailed description section. This summary is not intended to identify key features or essential features of the claimed subject matter, nor is it intended to be used to limit the scope of the claimed subject matter.

BRIEF DESCRIPTION OF THE DRAWINGS

The foregoing summary, as well as the following detailed description of preferred embodiments, is better understood when read in conjunction with the appended drawings. For the purposes of illustration, there is shown in the drawings exemplary embodiments; however, the present disclosure is not limited to the specific methods and instrumentalities disclosed. In the drawings:

FIG. 7 illustrates an example operational flow of a process to monitor the server rack and components therein.

DETAILED DESCRIPTION

The present disclosure describes a self-contained server rack that may be used in a server room to cool computing equipment. As will be described, the rack may contain a cooling unit or a cooling inlet to produce or receive chilled air to cool computing equipment within the server rack. The self-contained server rack may have a modular design such that it may be easily incorporated into a data center and to provide scalability. Because only the interior of the self-contained server rack needs to be cooled to prevent the computing equipment from overheating, this eliminates the need to cool entirety of the data center.

Figure 1:
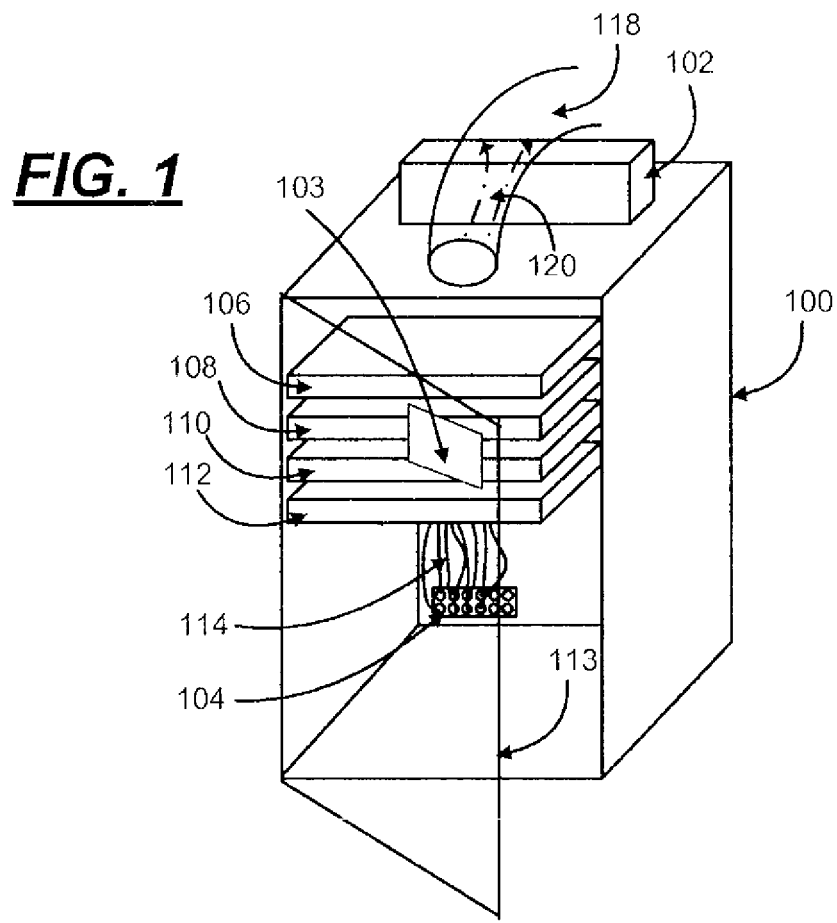
FIG. 1 illustrates a front perspective view of an example server rack.
Figure 2:
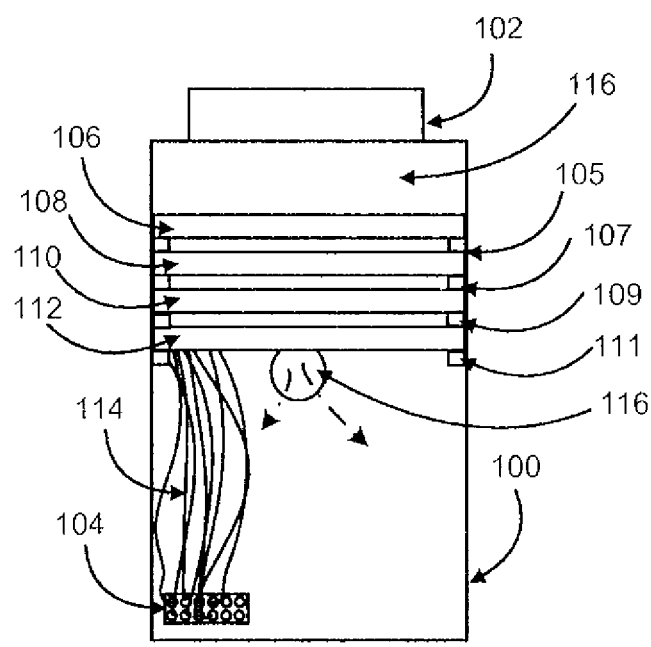
FIG. 2 illustrates a front view of the example server rack.

FIG. 1 illustrates a front perspective view of an example server rack 100, and FIG. 2 illustrates a front view of the server rack 100. As shown in FIGS. 1 and 2, the server rack 100 is formed generally as a self-contained rectangular enclosure having upper and lower walls, sidewalls, and a rear wall. One or more computing devices 106, 108, 110 and 112 may be mounted on racks 105, 107, 109 and 111, respectively, within the server rack 100. The computing devices 106, 108, 110 and 112 may be, e.g., blade servers, network equipment, power equipment, communications equipment, etc.

An integral cooling unit 102 may provide chilled air 116 or other fluid that may be circulated within the server rack 100 to cool the computing devices 106, 108, 110 and 112 contained therein. The chilled air 116 may be cooled by cooling unit 102 to a temperature that maintains the computing devices 106, 108, 110 and 112 at a safe internal operating temperature. In some implementations, the cooling unit 102 may contain an optimally sized air conditioner for the anticipated heat load contained within the server rack 100. For example, the anticipated heat load may be calculated based on the power consumption of devices mounted within the server rack 100.

As the chilled air 116 removes heat from the computing devices 106, 108, 110 and 112, the chilled air 116 warms due to the heat transfer and rises to the top of the server rack 100. The warmed air may be removed from the server rack 100 as exhaust 120 through an outlet 118. The outlet 118 may be connected to a manifold provided within a data center for venting the warmed air.

Electrical and network connections to the computing devices 106, 108, 110 and 112 may be made through a connector block 104. For example, connections such as power, Ethernet, fiber optic connections, coaxial, etc. may be made to the connector block 104 using cables 114. In some implementations, the connector block 104 may be a modular system, such that individual connections may be tailored to the connection requirements of the computing devices 106, 108, 110 and 112. In some implementations, the connector block 104 may include a standardized set of connectors to accommodate certain types of computing devices. For example, the connector block 104 may include a row of RJ45 sockets and a row of AC sockets to accommodate servers as the computing devices 106, 108, 110 and 112.

A door 113 may be provided to close the server rack 100. The door 113 may provide a seal along the front of the server rack 100 to create a closed system whereby the removal of heat generated by the computing devices 106, 108, 110 and 112 is accomplished through the circulation of the chilled air 116 to the exhaust 120.

An indicator panel 103 may be provided on the door 113 or other location to provide an indication of the operational status of the server rack 100, the cooling unit 102, and/or the computing devices 106, 108, 110 and 112. For example, the indicator panel 103 may indicate that the door 113 is ajar, that the cooling unit 102 has malfunctioned, that one of the computing devices 106, 108, 110 or 112 has crashed, or that everything is operating within normal parameters, etc. such that IT support technician may easily identify problems with or in the server rack 100.

Although FIGS. 1 and 2 illustrate four computing devices 106, 108, 110 and 112, any number of computing devices may be installed within the server rack 100 as space permits. Further, the cables 114 may be provided to make any type of connection to the connector block 104 as required by the computing devices 106, 108, 110 and 112. Thus, the cables 114 may be an Ethernet cable, power cord, etc.

Figure 3:
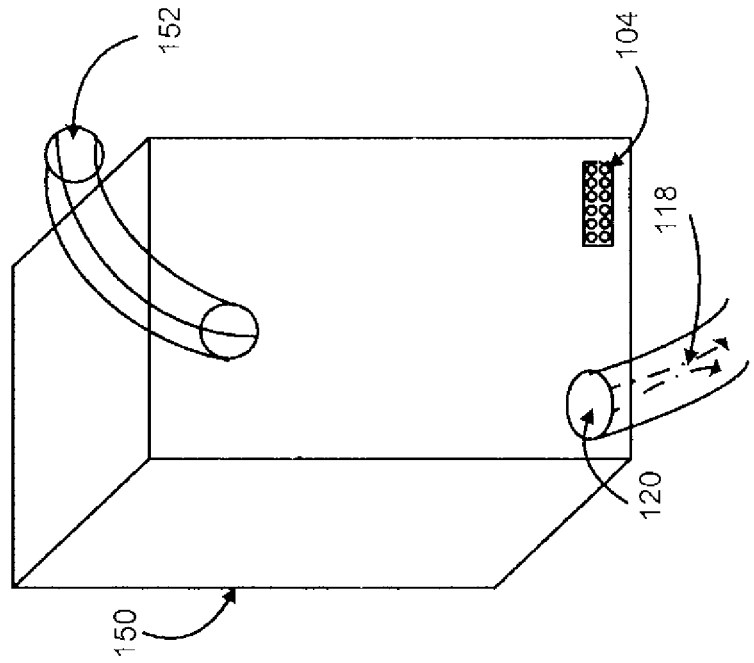
FIG. 3 illustrates a rear perspective view of the example server rack.

FIG. 3 illustrates a rear perspective view of the server rack 100. The connector block 104 extends through the rear wall of the server rack 100 to enable external connections to be made to the computing devices 106, 108, 110 and 112. Thus, the connector block 104 may serve as the external interface to the computing devices 106, 108, 110 and 112 where all connections are made. As will be described with reference to FIGS. 6 and 7, the connector block 104 is adapted to mate with a respective connector block within a floor module or mounting point in the data center to provide connections between a computing infrastructure and the computing devices 106, 108, 110 and 112.

Figure 4:
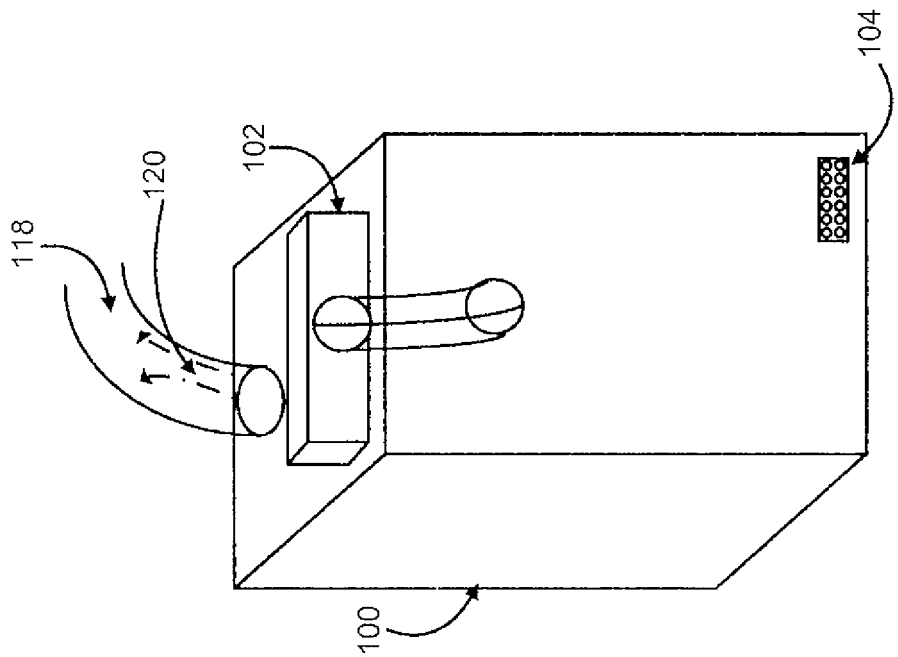
FIG. 4 illustrates a rear perspective view of another example server rack.

FIG. 4 illustrates a rear perspective view of another example server rack 150. The server rack 150 provides an inlet to receive a cooling duct 152 rather than having an integral cooling unit. The cooling duct 152 may provide chilled air from a cooling unit within the data center or from a cooling unit 102 on an adjacent or nearby server rack 100. Similar to the server rack 100, the connector block 104 extends through the rear wall of the self-contained server rack 150 to enable connections to be made to the computing devices 106, 108, 110 and 112. FIG. 4 also illustrates the server rack 150 having the outlet 118 at floor level. The outlet 118 may be connected to a manifold provided within a mounting point or floor module for venting the warmed air as exhaust 120. In some implementations, the server rack 100 may include the floor level outlet 118.

Figure 5:
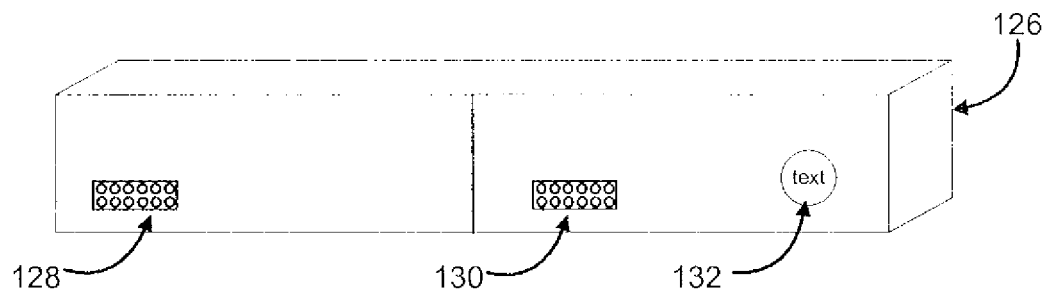
FIG. 5 illustrates a front perspective view of an example data center mounting point.
Figure 6:
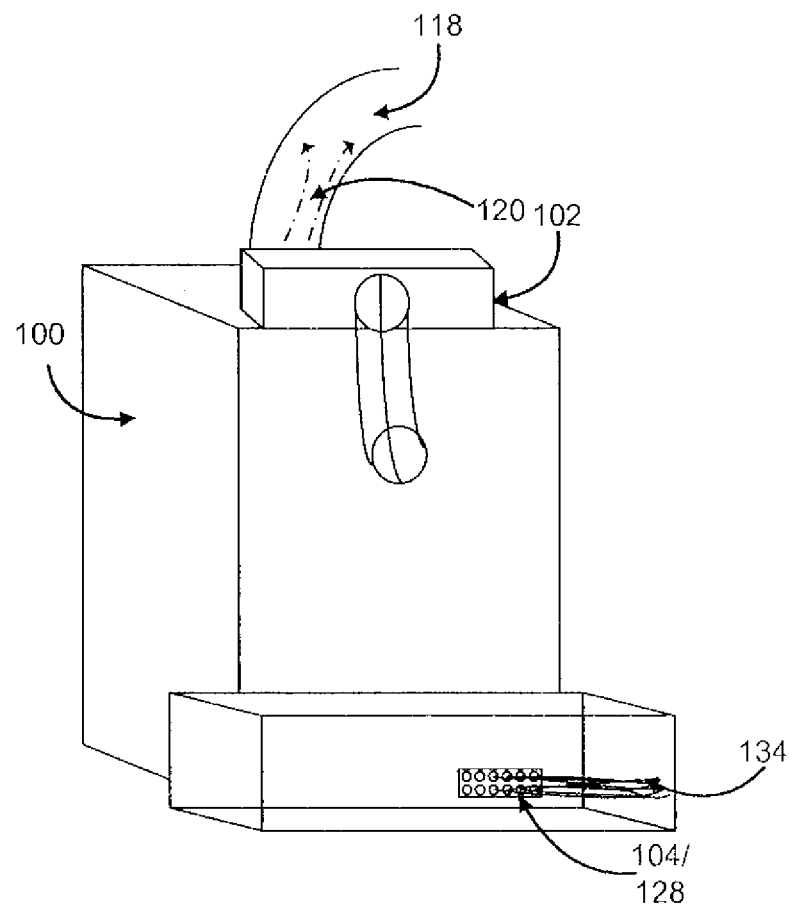
FIG. 6 illustrates a perspective view of the example server rack mounted to the data center mounting point.

FIG. 5 illustrates a front perspective view of an example floor mounting point 126, and FIG. 6 illustrates a perspective view of the example server rack 100/150 coupled to the floor mounting point 126. The floor mounting point 126 may include one or more connector blocks 128 and 130. The connector blocks 128 and 130 are designed to be a mirror image of the connector block 104 provided on the server rack 100/150 and is adapted to mate with the connector block 104 to provide power, network, etc. connections between the computing equipment 106, 108, 110 and 112 and the computing infrastructure within the data center.

In implementations where the outlet 118 is provided at floor level, an exhaust inlet 132 may be provided within the floor mounting point 126 to receive the outlet 118.

As shown in FIG. 6, the server rack 100/150 may be slid into place to mate with the floor mounting point 126. Multiple floor mounting points 126 may be provided in the data center to accept multiple self-contained server racks 100/150. As the data center's needs and requirements grow, additional self-contained server racks 100/150 and floor mounting points 126 may be installed within the data center to accommodate the needs of the data center. If the data center's needs are reduced, the server racks 100/150 and floor mounting points 126 may be removed. Thus, in accordance with the implementations described above, the cooling needs of computing equipment within the data center may be satisfied by cooling the space only within the server rack 100/150, eliminating the need to cool the entire data center. In addition, the cooling requirements can be scaled proportionally to the amount of computing equipment needed to meet the data center's computing requirements.

FIG. 7 illustrates an example operational flow of a process 200 to monitor the server rack 100/150 and components therein. In some implementations, the process 200 may be executed by a general purpose computer running a monitoring application within the data center. The process 200 may be part of an administrative application suite running on the general purpose computer to monitor the health and status of the self-contained server racks within the data center, as well as the computing equipment and devices contained within a self-contained server racks.

At 202, self-contained server rack is coupled to the mounting point. For example as shown in the FIG. 6, server rack 100/150 may be positioned in place such that the connector block 104 mates with the connector block 128. At 204, equipment is discovered by the network. For example, the server rack 100/150 and the computing devices 106, 108, 110 and 112 may be discovered by the data center and/or the computing infrastructure using network protocols such as SLP (service location protocol), Jini, UPnP (Universal plug and play), salutation, SDP (service discovery protocol), etc.

At 206, self-contained server rack and/or computing devices are configured. For example, the computing devices 106, 108, 110 or 112 may be authenticated and assigned an IP address from a DHCP server, and configured such that they are able to communicate with the computing infrastructure to which the data center is connected. Optionally or additionally, the server rack 100/150 may be configured such that it may be monitored by the monitoring application to determine the health and status of the self-contained server rack and the components therein. At 208, the self-contained server rack and/or computing devices are operational within a computing infrastructure.

At 210, the equipment and self-contained server rack are monitored. At 212, it is determined if a change occurred in the status of the server rack 100/150, the computing devices 106, 108, 110 or 112, or the cooling unit 102. If no change has occurred then the process returns to 210 to continue monitoring. However, if a change is that is has occurred at 212, then at 214, networking and/or an administrative application may be notified of the change. If at 216, it is determined that a new server rack 100/150 or new computing devices have caused the change, then the process returns to 206 where the new equipment is configured. If at 216, if the change in status was the result of some other cause, an alarm may be trigger to notify IT personnel of the change in status. The process returns to 210 to continue monitoring the equipment and server rack.

It should be understood that the various techniques described herein may be implemented in connection with hardware or software or, where appropriate, with a combination of both. Thus, the methods and apparatus of the presently disclosed subject matter, or certain aspects or portions thereof, may take the form of program code (i.e., instructions) embodied in tangible media, such as floppy diskettes, CD-ROMs, hard drives, or any other machine-readable storage medium wherein, when the program code is loaded into and executed by a machine, such as a computer, the machine becomes an apparatus for practicing the presently disclosed subject matter. In the case of program code execution on programmable computers, the computing device generally includes a processor, a storage medium readable by the processor (including volatile and non-volatile memory and/or storage elements), at least one input device, and at least one output device. One or more programs may implement or utilize the processes described in connection with the presently disclosed subject matter, e.g., through the use of an API, reusable controls, or the like. Such programs are preferably implemented in a high level procedural or object oriented programming language to communicate with a computer system. However, the program(s) can be implemented in assembly or machine language, if desired. In any case, the language may be a compiled or interpreted language, and combined with hardware implementations.

Although example embodiments may refer to utilizing aspects of the presently disclosed subject matter in the context of one or more stand-alone computer systems, the subject matter is not so limited, but rather may be implemented in connection with any computing environment, such as a network or distributed computing environment. Still further, aspects of the presently disclosed subject matter may be implemented in or across a plurality of processing chips or devices, and storage may similarly be effected across a plurality of devices. Such devices might include personal computers, network servers, and handheld devices, for example.

Although the subject matter has been described in language specific to structural features and/or methodological acts, it is to be understood that the subject matter defined in the appended claims is not necessarily limited to the specific features or acts described previously. Rather, the specific features and acts described previously are disclosed as example forms of implementing the claims.

The invention claimed is:

1. A method for monitoring a self-contained server rack system, comprising:
    discovering, by at least one hardware processor, the self-contained server rack system containing a plurality of equipment as being connected within a data center;
    discovering, by at least one hardware processor, the plurality of equipment within the self-contained server rack system, wherein the plurality of equipment is automatically discovered in response to connecting the self-contained server rack system to a single mounting point in the data center, and wherein the mounting point includes a single connector that connects all of the plurality of equipment in the self-contained server rack system;
    configuring, by at least one hardware processor, the self-contained server rack system;
    configuring, by at least one hardware processor, the plurality of equipment within the self-contained server rack system;
    monitoring, by at least one hardware processor, the self-contained server rack system and the plurality of equipment for changes in operational status; and
    configuring a cooling apparatus associated with the self-contained server rack system, wherein the cooling apparatus provides cooling to the self-contained server rack system based on a power consumption of the plurality of equipment contained in the self-contained server rack system.

2. The method of claim 1, further comprising configuring a cooling apparatus associated with the self-contained server rack system to maintain the plurality of equipment within a predetermined temperature range.

3. The method of claim 2, wherein the cooling apparatus is integral with the self-contained server rack system.

4. The method of claim 2, wherein the cooling apparatus vents air as exhaust through an outlet on the self-contained server rack system, the outlet connected to a manifold.

5. The method of claim 1, wherein the mounting point includes a connector providing external connections to the plurality of equipment within the self-contained server rack.

6. The method of claim 1, further comprising notifying an administrative application of the changes in operational status.

7. The method of claim 6, further comprising providing an indication of the operational status on an indicator panel provided on the self-contained server rack system.

8. A non-transitory computer-readable medium comprising computer-readable instructions executed by a processor to implement a method for monitoring a self-contained server rack system, the method comprising:
    discovering the self-contained server rack system containing a plurality of equipment as being connected within a data center;
    discovering the plurality of equipment within the self-contained server rack system, wherein the plurality of equipment is automatically discovered in response to connecting the self-contained server rack system to a single mounting point in the data center;
    configuring the self-contained server rack system, and wherein the mounting point includes a single connector that connects all of the plurality of equipment in the self-contained server rack system;
    configuring the plurality of equipment within the self-contained server rack system;
    monitoring the self-contained server rack system and the plurality of equipment for changes in operational status; and
    configuring a cooling apparatus associated with the self-contained server rack system, wherein the cooling apparatus provides cooling to the self-contained server rack system based on a power consumption of the plurality of equipment contained in the self-contained server rack system.

9. The computer-readable medium of claim 8, further comprising configuring a cooling apparatus associated with the self-contained server rack system to maintain the plurality of equipment within a predetermined temperature range.

10. The computer-readable medium of claim 9, wherein the cooling apparatus is integral with the self-contained server rack system.

11. The computer-readable medium of claim 9, wherein the cooling apparatus vents air as exhaust through an outlet on the self-contained server rack system, the outlet connected to a manifold.

12. The computer-readable medium of claim 8, wherein the mounting point includes a connector providing external connections to the plurality of equipment within the self-contained server rack.

13. The computer-readable medium of claim 8, further comprising instructions for notifying an administrative application of the changes in operational status.

14. The computer-readable medium of claim 13, further comprising instructions for providing an indication of the operational status on an indicator panel provided on the self-contained server rack system.

15. A system for monitoring a self-contained server rack system using a non-transitory computer-readable medium encoded with computer-readable instructions, the computer-readable instructions comprising instructions stored thereon that are executed by a processor, the system comprising:
- at least one subsystem to discover the self-contained server rack system containing a plurality of equipment as being connected within a data center;
- at least one subsystem to discover the plurality of equipment within the self-contained server rack system, wherein the plurality of equipment is automatically discovered in response to connecting the self-contained server rack system to a single mounting point in the data center, and wherein the mounting point includes a single connector that connects all of the plurality of equipment in the self-contained server rack system;
- at least one subsystem to configure the self-contained server rack system;
- at least one subsystem to configure the plurality of equipment within the self-contained server rack system;
- at least one subsystem to monitor the self-contained server rack system and the plurality of equipment for changes in operational status; and
- at least one subsystem to configure a cooling apparatus associated with the self-contained server rack system, wherein the cooling apparatus provides cooling to the self-contained server rack system based on a power consumption of the plurality of equipment contained in the self-contained server rack system.

16. The system of claim 15, further comprising at least one subsystem to configure a cooling apparatus associated with the self-contained server rack system to maintain the plurality of equipment within a predetermined temperature range.

17. The system of claim 16, wherein the cooling apparatus is integral with the self-contained server rack system.

18. The system of claim 16, wherein the cooling apparatus vents air as exhaust through an outlet on the self-contained server rack system, the outlet connected to a manifold.

19. The system of claim 15, wherein the mounting point includes a connector providing external connections to the plurality of equipment within the self-contained server rack.

20. The system of claim 15, further comprising at least one subsystem to notify an administrative application of the changes in operational status.

21. The system of claim 20, further comprising at least one subsystem to provide an indication of the operational status on an indicator panel provided on the self-contained server rack system.

* * * * *